(12) United States Patent
Galy et al.

(10) Patent No.: US 7,889,468 B2
(45) Date of Patent: Feb. 15, 2011

(54) PROTECTION OF INTEGRATED ELECTRONIC CIRCUITS FROM ELECTROSTATIC DISCHARGE

(75) Inventors: Philippe Galy, Lumbin (FR); Laurent Micheli, Vif (FR); Ghislain Troussier, Crolles (FR); Mickael Rien, Biviers (FR); Jean-Francois Veniant, La Tronche (FR)

(73) Assignee: STMicroelectronics SA, Montrouge (FR)

( * ) Notice: Subject to any disclaimer, the term of this patent is extended or adjusted under 35 U.S.C. 154(b) by 410 days.

(21) Appl. No.: 12/022,700

(22) Filed: Jan. 30, 2008

(65) Prior Publication Data

US 2008/0218919 A1    Sep. 11, 2008

(30) Foreign Application Priority Data

Jan. 31, 2007    (FR) .................................. 07 00688

(51) Int. Cl.
*H02H 9/00*    (2006.01)

(52) U.S. Cl. .......................... 361/56; 361/91.5; 361/111

(58) Field of Classification Search ................... 361/56, 361/88, 91.5, 111
See application file for complete search history.

(56) References Cited

U.S. PATENT DOCUMENTS

| | | | |
|---|---|---|---|
| 5,191,641 A | 3/1993 | Yamamoto et al. | 395/118 |
| 6,144,542 A * | 11/2000 | Ker et al. | 361/111 |
| 7,268,003 B2 * | 9/2007 | Hayashi | 438/17 |
| 2004/0070900 A1* | 4/2004 | Ker et al. | 361/56 |
| 2004/0100314 A1* | 5/2004 | Kim et al. | 327/176 |
| 2004/0212936 A1* | 10/2004 | Salling et al. | 361/56 |
| 2005/0001817 A1 | 1/2005 | Lauffenburger et al. | 345/166 |
| 2008/0106834 A1* | 5/2008 | Hung | 361/56 |

FOREIGN PATENT DOCUMENTS

| | | |
|---|---|---|
| EP | 0 742 510 | 11/1996 |
| EP | 1 095 821 | 5/2001 |
| EP | 1 182 606 | 2/2002 |
| EP | 1 291 810 | 3/2003 |
| EP | 1 574 994 | 9/2005 |
| JP | 2000151382 | 5/2000 |

OTHER PUBLICATIONS

C.J. Brennan et al., "ESD design automation & methodology to prevent CDM failures in 130 & 90 nm ASIC design systems," Journal of Electrostatics, vol. 64, 2006, pp. 112-127.

(Continued)

*Primary Examiner* — Jared J Fureman
*Assistant Examiner* — Christopher J Clark
(74) *Attorney, Agent, or Firm* — Lisa K. Jorgenson; David C. Conlee; Seed IP Law Group PLLC

(57) ABSTRACT

Circuit nodes are identified which, in unpowered mode, can be charged with positive or negative charges but cannot be discharged. Then protective elements are added to allow the discharge of these nodes. These elements do not affect the operation of the circuit in powered mode. Discharges of the two polarities are handled, positive and negative. The circuit is thus more resistant to ESD and passes CDM tests.

21 Claims, 7 Drawing Sheets

OTHER PUBLICATIONS

Y. Huh et al., "ESD-induced Internal Core Device Failure: New Failure Modes in System-on-Chip (SOC) Designs," Proceedings of the 9$^{th}$ International Database Engineering & Application Symposium, 2005, pp. 1-7.

J. Lee et al., "Chip-Level Charged-Device Modeling and Simulation in CMOS Integrated Circuits," IEEE Transactions on Computer-Aided Design of Integrated Circuits and Systems, vol. 22, No. 1, Jan. 2003, pp. 67-81.

H. Voldman, "ESD RF Technology and Circuits," Section 2.10.5.

* cited by examiner

PROTECTION OF INTEGRATED ELECTRONIC CIRCUITS FROM ELECTROSTATIC DISCHARGE

BACKGROUND

1. Technical Field

The invention relates to the protection of integrated electronic circuits from ESD (Electrostatic Discharge).

It relates in general to the design of integrated electronic circuits, and more particularly to the tests used to assist with circuit design, particularly ESD sensitivity tests.

2. Description of the Related Art

These tests are intended to evaluate the robustness of integrated electronic circuits when they are exposed to electrostatic discharge, and to find design rules to limit the stresses related to such electrostatic discharge.

For determining the sensitivity of integrated electronic circuits to electrostatic discharge, there are standardized models representing the hostile environment in which these circuits live. These models are used during the testing phase in particular to assist with the electronic circuit design.

Electrostatic discharges can be so modeled using the Charged Device Model or CDM. The CDM is a standardized model which has the unique characteristic, unlike other known models, of representing the discharge from an integrated electronic circuit when assembled in a package. It allows taking into account, in terms of ESD sensitivity, the effect of the package in which the electronic circuit is placed. Note that in this context the package is defined in particular by the coating material, the connecting pins, the wires, the base or substrate, the glue, and of course the silicon chip.

CDM tests is understood to mean ESD sensitivity tests for integrated electronic circuits which are based on the CDM model.

The CDM tests themselves pose a problem regarding integrated electronic circuit reliability, which is accentuated by the reduction of the characteristic sizes of MOS transistors and the corresponding increase in the level of integration. During a CDM test, the circuit is exposed to electrical stress, also called CDM stress, in the form of currents of several amperes lasting for several nanoseconds, with a rise time of several dozen picoseconds. This CDM stress can result in damage to the circuit. In particular, CDM stress can result in short circuits or conversely in open circuits in the gate oxide layers of MOS transistors, in other irreversible deterioration, and in leakage currents.

In the prior art, the protection of integrated electronic circuits is done in three distinct regions: inputs, outputs, and power supplies. Basic structures which protect from ESD, optimized for each technology, are inserted into the integrated circuit to be protected (known as "in situ" protection) in a manner which:

combats positive and negative ESD discharges, leaves unaffected the functionality of the circuit under normal operating conditions, meaning when the circuit is exposed to its operating voltage ("powered" mode), levels high voltages and drains off the discharge current, occupies as little space as possible, and, does not introduce additional steps in the component manufacturing process.

Even so, many components do not withstand the phases of the ESD sensitivity test because of irreversible damage arising from the CDM stress.

Completely independently of considerations related to CDM stress, it is known to protect the metal lines against the charge that occurs during the manufacture of an electronic circuit due to exposure to a plasma. Such exposure is one of the methods used to etch metal. This charge is known as the plasma charge and is the origin of later failures. It is perceptible for lines of a length exceeding several dozen microns. Because of their length, such lines are generally antenna lines. It is known to create a protective element based on a diode or diodes, called an "antenna diode", in order to drain off the charges accumulated in these lines. Such an element is available in the component libraries which are available to integrated circuit designers.

BRIEF SUMMARY

One embodiment improves the protection of electronic circuits from CDM stress, meaning from the electrical stresses applied during a CDM test.

One embodiment is an integrated electronic circuit comprising an assembly of components forming a network of circuit nodes connected by circuit branches, wherein:

at least one first circuit node is coupled to one or more circuit branches which, when the electronic circuit is not exposed to the operating voltage, only allow the discharge of said first node for electrical charges of a first polarity, positive or negative, but not for electrical charges of a second polarity, negative or positive respectively, and at least one second circuit node is coupled to one or more circuit branches which, when the electronic circuit is not exposed to the operating voltage, only allows the discharge of said second node for electrical charges of the second type but not for electrical charges of the first type.

In some embodiments of the invention, the circuit further comprises:

a first protective element associated with the first circuit node and which is adapted to allow the discharge of said first circuit node for charges of the second type, when the electronic circuit is not exposed to the operating voltage, and not to allow the flow of an electrical current to or from said first node when the electronic circuit is exposed to the operating voltage, and a second protective element associated with the second circuit node and which is adapted to allow the discharge of said second circuit node for charges of the first type, when the electronic circuit is not exposed to the operating voltage, and not to allow the flow of an electrical current to or from said second node when the electronic circuit is exposed to the operating voltage.

The inventors observe that charges which travel the electronic circuit during a CDM test are charges induced by CDM pulses of both polarities, positive and negative, and that the layout of current highly integrated circuits results in situations where circuit nodes are not associated with electrical conduction paths allowing the discharge of both polarities. In fact, electronic circuit nodes may behave like true capacitors. Nodes can be the site of an accumulation of positive charges (e+ holes) or negative charges (e− electrons) which respectively raise or lower the electric potential at these nodes.

When a discharge path exists which allows draining off charges of each polarity to the respective power rails, everything proceeds smoothly. But when, because of the electronic circuit layout, there are nodes from which the accumulated positive or negative charges cannot be drained off, significant local potential differences arise relative to neighboring zones in the circuit. These can produce disruptive discharges. Potential differences can thus be the origin of damage observed in the field. Hereinafter such nodes are called capacitive islands. Such capacitive islands are found, for example, in the common node between the drain and the source of two cascade-connected MOS transistors of the same family (NMOS or PMOS).

In the inventors' observation, these capacitive islands explain the fragility of the integrated electronic circuit with respect to CDM stress, with the aforementioned potential differences resulting in phenomena of disruptive discharges in dielectric areas and junctions in integrated electronic circuits. One embodiment avoids this fragility, to the extent that it allows the discharge of charges of each polarity accumulated in any capacitive island during a CDM test, by providing a discharge path from said island.

It is advantageous when the protection means, added to the electronic circuit to protect the capacitive islands from overloading, does not modify the normal operation of the circuit when it is active, meaning when it is exposed to an operating voltage. In this case the one-way conduction element is polarized in the opposite direction such that the protection means acts as an open circuit.

The "antenna diode" protective elements mentioned in the introduction may happen to be associated with capacitive islands in the sense of the present description. Such elements, provided for an entirely different purpose, can then carry out the function of the protective elements as defined in the present description. However, these "antenna diodes" are only provided to protect against the accumulated charges of one polarity. Therefore they would not protect the circuit even in this fortuitous manner, as the circuit would be protected against only a part of the CDM stress.

One embodiment is a process to assist with the design of an integrated electronic circuit comprising method an assembly of components forming a network of circuit nodes connected by circuit branches and intended to have a given operation when the electronic circuit is exposed to an operating voltage, comprising the following steps:

identification of at least one first circuit node coupled to one or more circuit branches which, when the electronic circuit is not exposed to an operating voltage, only allow the discharge of said first node for electrical charges of a first polarity, positive or negative, but not for electrical charges of a second polarity, negative or positive respectively, identification of at least one second circuit node coupled to one or more circuit branches which, when the electronic circuit is not exposed to an operating voltage, only allow the discharge of said second node for electrical charges of the second type but not for electrical charges of the first type, addition of a first protective element associated with the first circuit node and which is adapted to allow the discharge of said first circuit node for charges of the second type, when the electronic circuit is not exposed to the operating voltage, and not to allow the flow of an electrical current to or from said first node when the electronic circuit is exposed to the operating voltage, and addition of a second protective element associated with the second circuit node and which is adapted to allow the discharge of said second circuit node for charges of the first type, when the electronic circuit is not exposed to the operating voltage, and not to allow the flow of an electrical current to or from said second node when the electronic circuit is exposed to the operating voltage.

At least the identification steps can be implemented by a correctly programmed computer. The addition of protective elements can thus be done automatically, under the control of the program. The method can therefore be implemented wholly or in part as computer-aided circuit design software (CAD).

BRIEF DESCRIPTION OF THE SEVERAL VIEWS OF THE DRAWINGS

Other features and advantages will become more apparent upon reading the description which follows. This description is purely illustrative and is to be read while referring to the attached drawings, in which.

DETAILED DESCRIPTION

Unlike conventional ESD sensitivity test models, in which the modeled electrostatic discharge is from the testing apparatus towards the integrated circuit being tested, the charged device model or CDM represents the discharge from an integrated circuit. It is possible for components to become charged by triboelectricity, so the composition of the components (packages, size of chip and internal capacitance) is ideally taken into account in the CDM.

Figure 1:
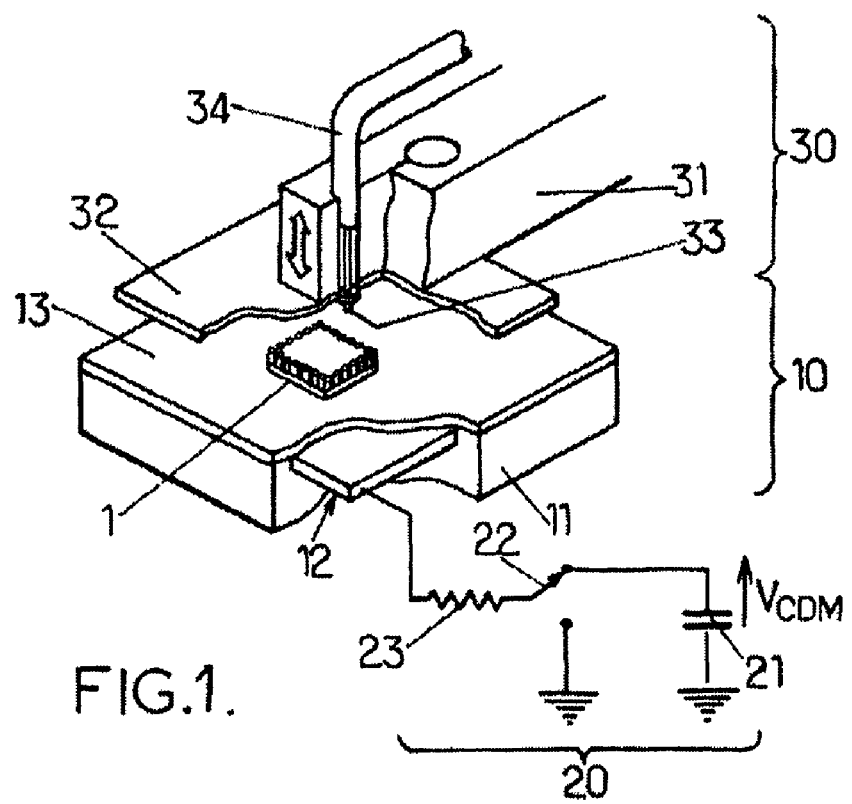
FIG. 1 is a schematic representation of a CDM test apparatus.

As shown in FIG. 1, a FCDM ("Field CDM") test device comprises an immobile charging assembly 10, to which a charging device 20 is coupled, as well as a discharging assembly 30 which is mobile relative to the charging assembly.

The charging assembly 10 comprises a support 11, a plate forming the charging electrode 12, covered by insulation 13 (FR-4), with the electrode 12 and the insulation 13 being solidly attached to the support 11.

The charging device 20 comprises a high voltage source 21 which delivers a high CDM voltage, referred to below and in the figures as $V_{CDM}$. Typically, the $V_{CDM}$ voltage is about 500 V to 1 kV. This voltage can be negative or positive. The high voltage source 21 can be selectively coupled, meaning in a manner controlled by a switch 22, to the charging electrode 12 across a charging resistor 23, for which the resistance value is referred to below and in the figures as $R_{CHRG}$. Typically, the resistance $R_{CHRG}$ is about 500 MΩ to 1 GΩ.

The discharging assembly comprises a mobile supporting arm 31, a ground plate forming a discharging electrode 32, as well as a discharging probe 33 ("POGO Probe"). The plate 32 and the probe 33 are solidly attached to the arm 31. This arm is mobile and can be controlled such that the probe 33 is moved in a plane parallel to the plane of the charging assembly 10, and vertically relative to it. The probe 33 is connected to a recording and viewing device (not represented) by an insulated cable 34 such as a coaxial cable. The core of the coaxial cable is connected to the probe 33, and to the plate 32 by a radial resistor with a very low resistance value, referred to below and in the figures as $R_{TEST}$. Typically the $R_{TEST}$ resistance is equal to about 1Ω.

When operational, the plate 32 moves appreciably to the right of the charging electrode 12. The dimensions of the charging electrode 12 and the ground plate 32 are substantially identical, and greatly superior to those of the integrated circuits to be tested.

Figure 2:
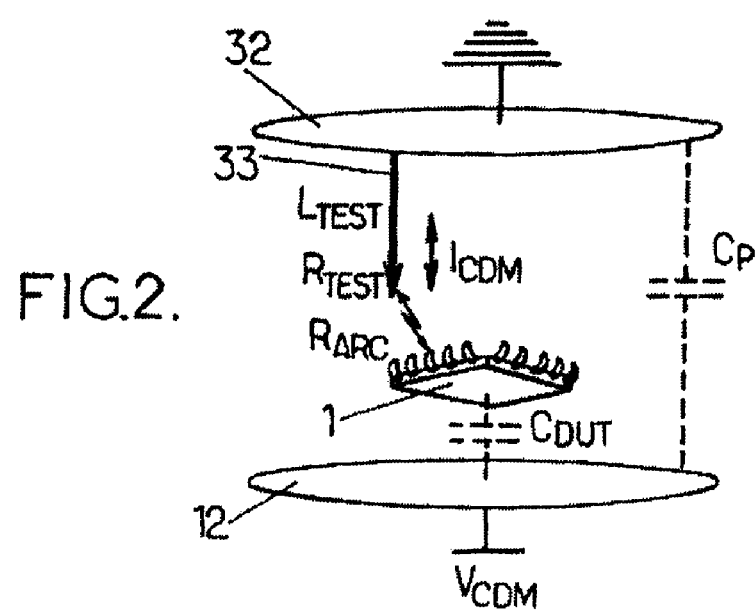
FIG. 2 is a diagram symbolically illustrating the electrostatic discharge phenomenon which occurs during a CDM test operation.

Referring to the diagram in FIG. 2 as well, the principle of the FCDM ("Field CDM") test is as follows. The integrated circuit 1 to be tested, or DUT ("Device Under Test") is placed with its pins facing up ("dead-bug") on top of the charging assembly. The charging device is controlled so that the voltage $V_{CDM}$ is applied to the charging plate 12. The circuit 1 is then charged at this voltage, by charge convection (and not by charge conduction). The charge accumulated in the circuit 1 is labeled $C_{DUT}$. Then the arm 31 of the discharging assembly is controlled such that the probe 33 comes into contact with one of the pins of the circuit 1. In fact, even before the contact occurs, an arc appears between the tip of the probe 33, which is at the ground potential, and the circuit 1. The resistance value of this electric arc is labeled $R_{ARC}$. Through this electrical arc, then through conduction when contact is actually made, a discharge current labeled $I_{CDM}$ flows from the circuit 1 to the discharging electrode 32 through the probe 33 and the radial resistor $R_{TEST}$ mentioned above. The inductance value specific to the probe 33 is labeled $L_{TEST}$.

A discharge then abruptly occurs between the circuit 1 and the ground, towards the discharging plate when the voltage $V_{CDM}$ is positive, or from this plate when the voltage $V_{CDM}$ is negative. This abrupt discharge is expressed as a current $I_{CDM}$. The source of the pulse is then the device itself, and the role of the package of the circuit 1 under test is taken into account.

Figure 3:
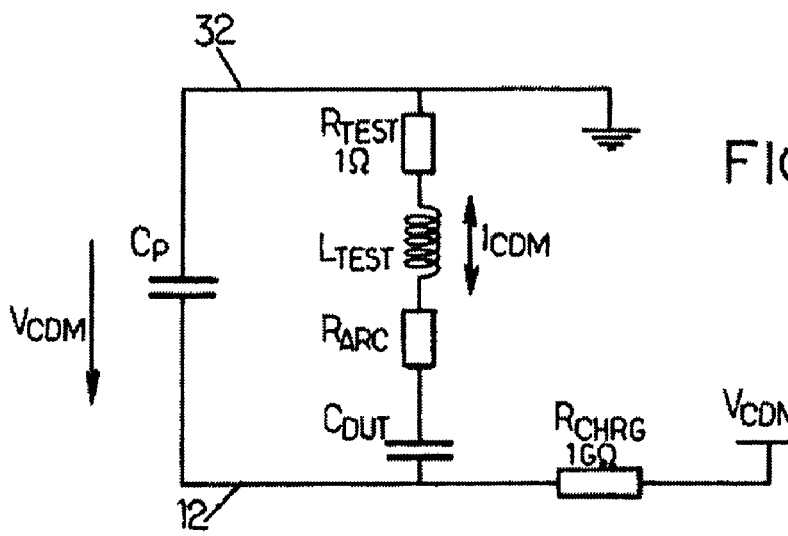
FIG. 3 is a simplified electrical diagram modeling the discharge phenomenon.

The equivalent electrical diagram is given in FIG. 3, in which, in addition, the capacitance value of the capacitor formed by the two plates 12 and 32 is labeled $C_P$. As can be seen, the equivalent electrical diagram is that of an oscillating RLC circuit. The response of such a circuit to pulsed excitation, to which the discharge corresponds, is the response of a damped circuit.

Figure 4:
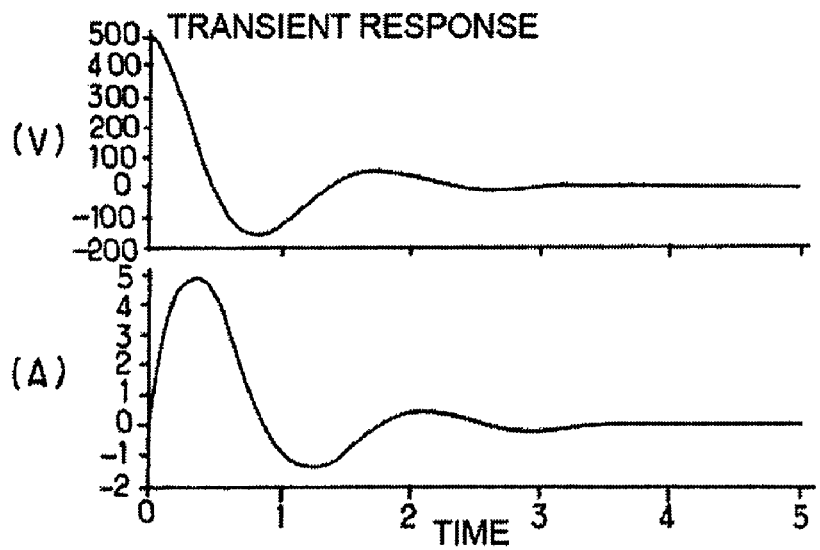
FIG. 4 shows the voltage and current response graphs for a positive CDM pulse.
Figure 5:
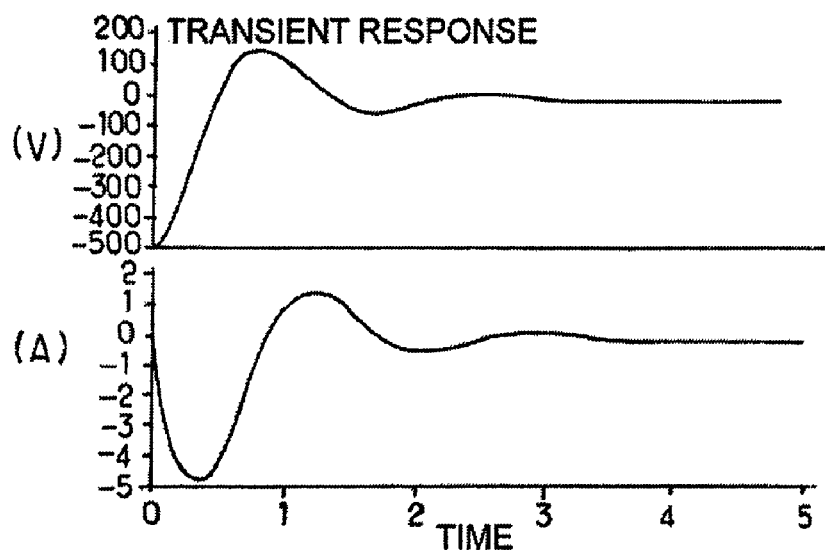
FIG. 5 shows the voltage and current response graphs for a negative CDM pulse.

The graphs in FIGS. 4 and 5 each show the general appearance of the voltage (top curve) and current (bottom curve) read at the probe 33, for a CDM voltage of +500 V and for a CDM voltage of −500 V.

In practice, the same test is successively performed for all pins of the circuit under test. With the tests, analysis of the wave forms and analysis of the operation of the circuit allow determining the ESD sensitivity of the circuit.

Note that in the case of a FCDM test device as envisaged in the above example, the circuit is charged with an electric field, but there exist CCDM ("Contact CDM") test devices in which the circuit is charged through contact.

In the example device described above with reference to FIG. 1, the component under test is placed with pins oriented upwards on a charging electrode, but in one variant, it can be inserted into a testing socket or SCDM ("Socketed CDM").

An integrated electronic circuit comprises an assembly of components forming a network of circuit nodes connected by circuit branches.

Note that, during the CDM test, the circuit under test is not exposed to its operating voltage. This is called "unpowered" mode. In this unpowered mode, the various nodes of the electronic circuit are floating, because, in the absence of any voltage, they are not polarized. However, during positive or negative electrostatic discharges, depending on the layout of the circuit, the circuit branches may be traveled by currents of positive or negative charges depending on the polarity of the CDM pulse created. As a result, the circuit nodes assume either a positive or negative charge, depending on the currents of electrostatic origin flowing within the circuit by conduction, as long as the circuit layout provides the associated paths.

It has been observed that, due to an electronic circuit layout resulting from the desired function for which the circuit was designed, there may be nodes for which there exists at least one charge path for a positive or negative charge, but no corresponding discharge path. In the present description, the expression "capacitive island" is used to refer to such nodes.

Figure 6:
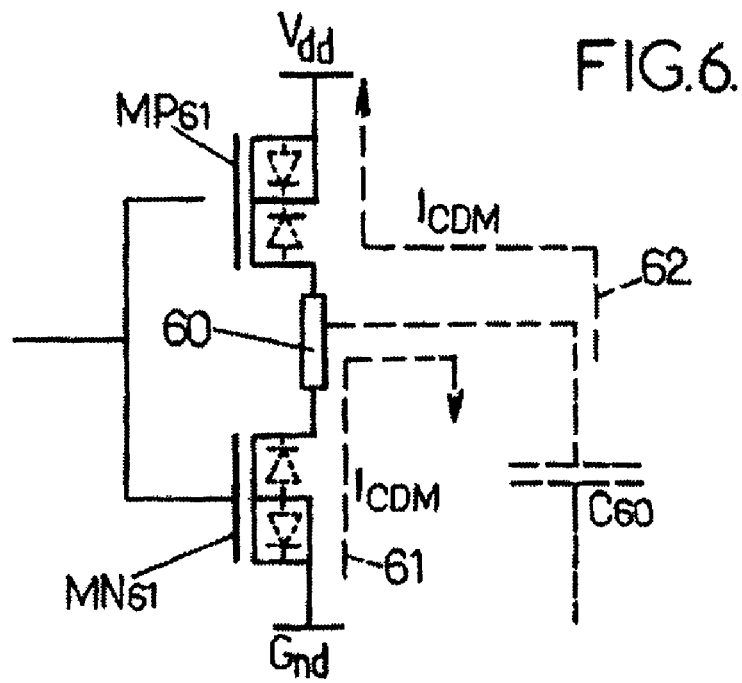
FIG. 6 is a schematic representation of a portion of an electronic circuit which is not a capacitive island in the sense of the present description.

There also exist zones which have both a discharge path for positive charges and a discharge path for negative charges associated with them. As shown in the diagram in FIG. 6, the common drain 60 between a PMOS transistor, labeled MP61, and a NMOS transistor, labeled MN61, of a CMOS inverter placed between a power supply potential Vdd and the ground Gnd, does not form a capacitive island in the sense of the present description. Of course, this node can, as can any node in an electronic circuit, be likened to a capacitance C60 (represented as dotted lines) between the node in question and its environment, and be positively or negatively charged.

Even so, there exists a discharge path 61 for negative charges from this node 60 to the ground Gnd, passing through the parasitic substrate-drain diode of the transistor MN61 (the parasitic diodes of the transistors MN61 and MP61 are also represented as dotted lines), with the substrate area (bulk or dye) of the transistor MN61 being coupled to the ground Gnd. And there also exists a discharge path 62 for positive charges from this node 60 to the terminal Vdd, passing through the parasitic drain-substrate diode of the transistor MN61, with the substrate area of the transistor MN61 being coupled to the voltage terminal Vdd. These discharge paths 61 and 62 are represented as dotted lines in FIG. 6. They allow the flow of a discharge current, labeled $I_{CDM}$ in both cases, during a CDM test.

Note also that the discharge paths 61 and 62 act by their very nature, even when no power is applied to the circuit (unpowered mode, which is the mode the circuit is in during a CDM test). The negative charges as well as the positive charges which can reach the node 60 during an electrostatic discharge such as those created during a CDM test are therefore drained off towards the ground or towards the terminal Vdd respectively, and so do not accumulate at the node 60. It is in this sense that the node 60 is said not to be a capacitive island in the sense of the present description. The charges drained off in this manner from the node 60 to the voltage terminals are then locally handled by the protective elements provided on these terminals in the manner already known.

An example of a capacitive island will now be described with reference to the diagram in FIG. 7.

In this figure, a portion of an electronic circuit has been represented, corresponding to a pair of cascading MOS transistors. These are two NMOS, labeled MN71 and MN72, serially placed between a node A and a node B of the circuit. More specifically, the drain of MN71 is connected to node A, the source of MN72 is connected to node B, while the source of MN71 and the drain of MN72 are connected to a common node 70. The substrate areas of the MN71 and MN72 NMOS are connected to the ground Gnd as is conventional.

As will now be seen, the node 70 is a capacitive island in the sense of the present description. Of course, the description which follows also applies in the case (not represented) of a pair of cascading PMOS transistors, for which the common node is also (for reasons of symmetry) a capacitive island.

Figure 7:
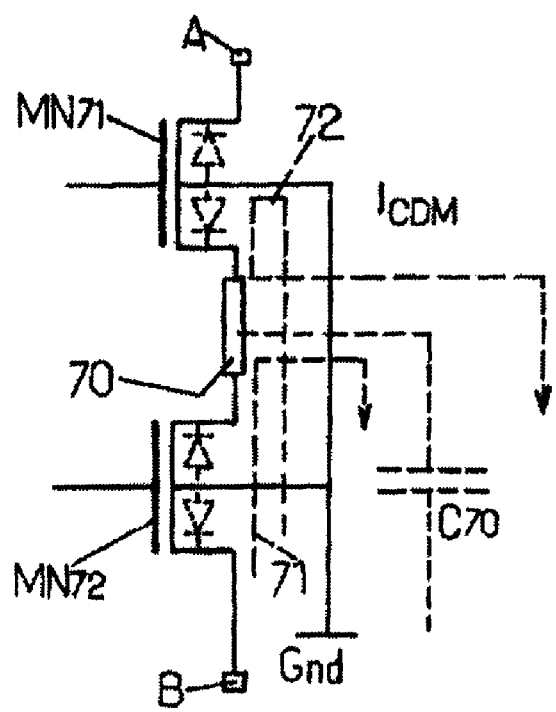
FIG. 7 is a schematic representation of a portion of an electronic circuit which, on the contrary, is a capacitive island in the sense of the present description.

In FIG. 7, the equivalent capacitance of the node 70 is labeled C70. In unpowered mode, there exists a first and a second discharge path for the node 70 to the ground, respectively labeled 71 and 72. The path 71 starts at the ground (to which the source and the substrate of MN72 are connected) and traverses the parasitic substrate-drain diode of MN72. This is a discharge path for negative charges. The second path 72 also starts at the ground (to which the substrate of MN71 is connected) and traverses the source-gate diode of MN71. This is also a discharge path for positive charges.

However, no discharge path exists for positive charges. In fact, the parasitic source-substrate diode of MN71 and the parasitic substrate-drain diode of MN72 oppose the flow of positive charges towards the terminal Vdd from the node 70. As a result, such charges can accumulate during an ESD and particularly during a CDM test, with the resulting drop in potential giving rise to the damage mentioned in the introduction when it exceeds a critical value.

For other nodes in the circuit, for example the common node between two cascade-connected PMOS transistors, the reverse is true as we have seen. There exists at least one discharge path for positive charges, but no discharge path for negative charges. The electrical phenomena are symmetrical, with the same consequence of possible damage to the circuit from ESD, particularly during a CDM test.

A general solution to this problem will now be described while referring to FIG. 8, in which two parts of the same electronic circuit 100 are represented.

The first part, at the top left, corresponds to the part of the circuit described above with reference to FIG. 7. It is reproduced with the same labels and will not be described again here. This is a part of a circuit comprising a node (the capacitive island 70) of the first type, meaning it has at least one discharge path for positive charges but no discharge path for negative charges. The substrate areas of the NMOS are connected to the ground Gnd.

The second part, at the bottom right, corresponds to the symmetrical case of the part of the circuit described above with reference to FIG. 7, because it concerns a pair of cascade-connected PMOS transistors between a node A' and a node B'. These two PMOS are labeled MP71 and MP72, and the common node between these two transistors is labeled 70'. Similarly, the equivalent capacitance for the node 70' is labeled C70' (represented as dotted lines). This part of the circuit comprises a node (the capacitive island 70') of the second type, meaning it has at least one discharge path for negative charges but no discharge path for positive charges. The substrate areas of the PMOS are connected to the positive voltage terminal Vdd.

In some embodiments of the invention, there is at least one protective element 73 for the capacitive island 70 (protective element of a first type), and at least one protective element 73' for the capacitive island 70' (protective element of a second type).

In one embodiment, one and/or the other of the protective elements 73 and 73' is a diode. Preferably it is an antenna diode, because this is generally the smallest diode (meaning it occupies the least silicon area) which is available in the component libraries available to the circuit designer.

The diode 73, which is said to be an element of the first type because it protects the node 70, is coupled to the node by its anode and to the positive voltage terminal Vdd by its cathode. Thus in unpowered mode it creates a discharge path for positive charges from the node 70 to the terminal Vdd. This path has no influence on the operation of the circuit in powered mode. In fact, when positive voltage is applied to the terminal Vdd, the diode 71 is polarized in the reverse direction such that no current can flow through it.

Symmetrically, the diode 73', which is said to be an element of the second type because it protects the node 70', is coupled to the node by its cathode and to the ground terminal Gnd by its anode. Thus in unpowered mode it creates a discharge path for negative charges from the node 70' to the ground. This path has no influence on the operation of the circuit in powered mode. In fact, when positive voltage is applied to the terminal Vdd, the diode 73' is polarized in the reverse direction such that no current can flow through it.

Figure 9:
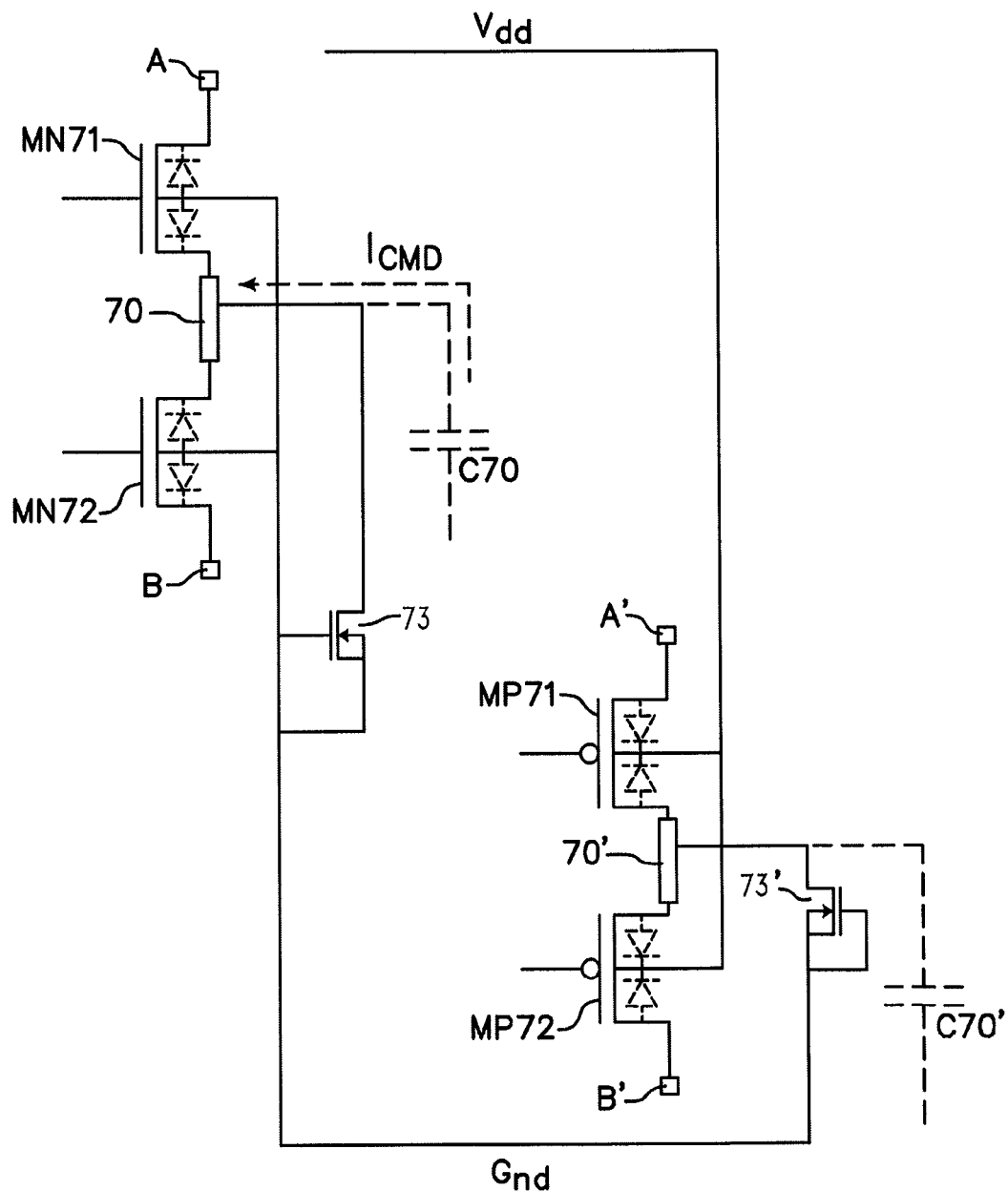
FIG. 9 is a schematic representation of an electronic circuit comprising a protective element according to one embodiment.

In one variant, one and/or the other of the protective elements 73 and 73' is a ggNMOS (Grounded Gate NMOS) transistor as illustrated in FIG. 9. Such a transistor occupies more silicon area than a simple diode but can drain off more current. The nodes to be protected 70 and 70' are then connected to the drain of the ggNMOS transistor while the gate, source and substrate of this transistor are connected together to the ground terminal Gnd. In this manner, the component is disabled during normal use of the integrated circuit in powered mode such that it does not affect the operation of the circuit in said mode. It does not modify the functionality of the circuit.

Figure 10:
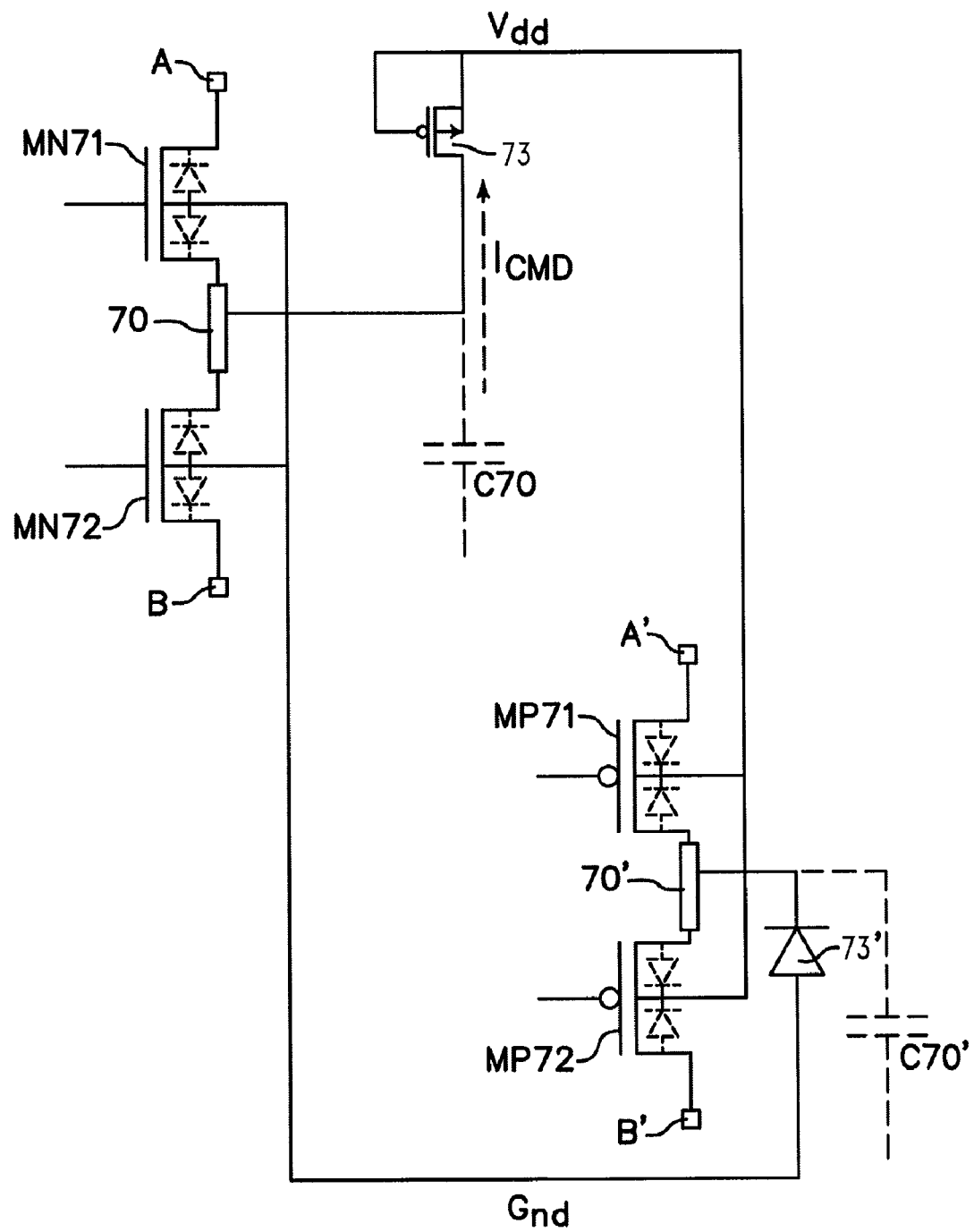
FIG. 10 is a schematic representation of an electronic circuit comprising a protective element according to one embodiment.

In another variant, the protective element 73 can be a PMOS transistor whose gate, source, and substrate are connected to the voltage terminal Vdd and whose drain is coupled to the node 70 to be protected as illustrated in FIG. 10.

Figure 11:
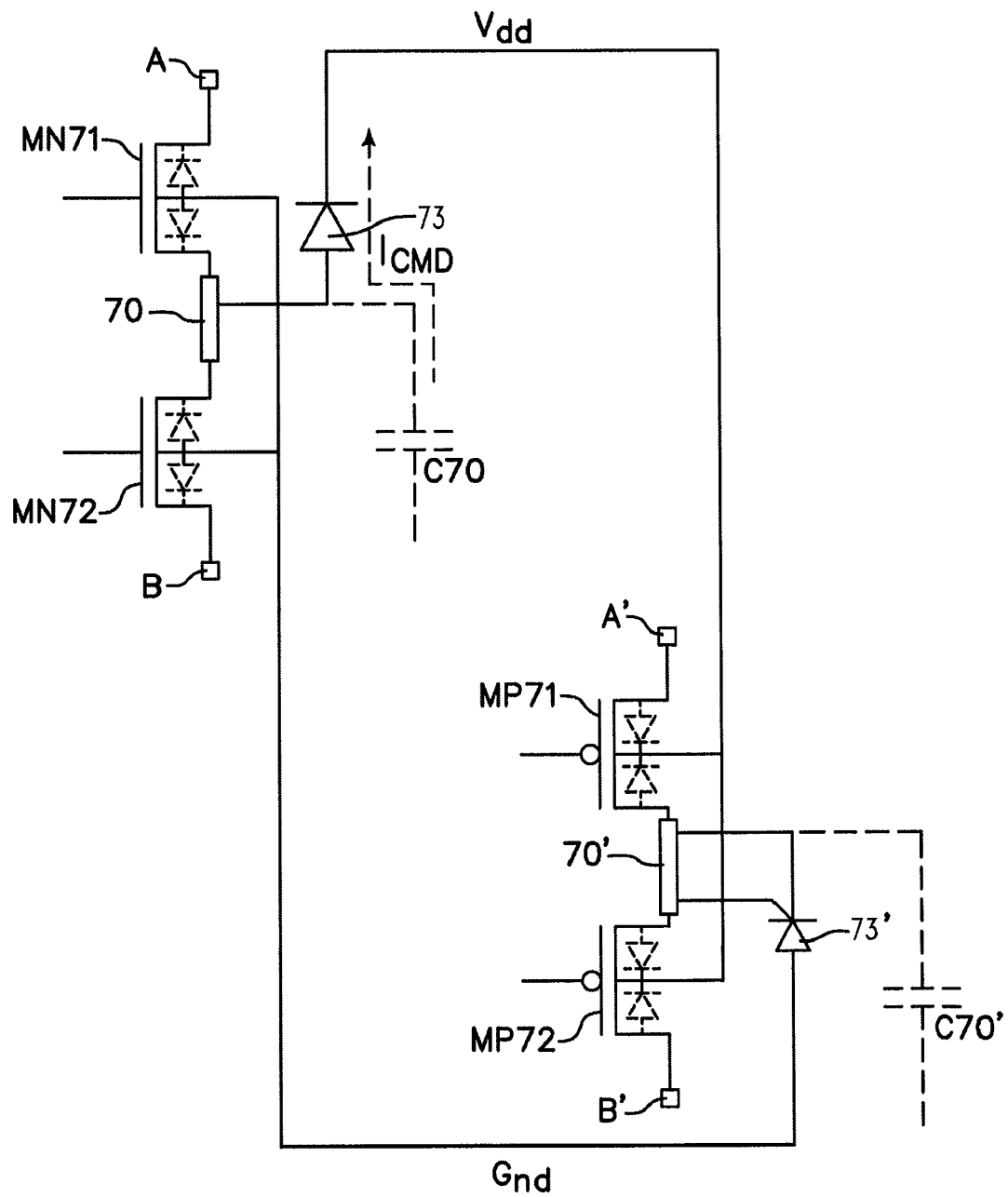
FIG. 11 is a schematic representation of an electronic circuit comprising a protective element according to one embodiment.

The protective element 73' can be a thyristor arranged to allow the discharge of negative charges towards the ground Gnd as illustrated in FIG. 11.

In other variants, the protective elements can be different, or be created from an assembly of components already cited, possibly in combination with other components.

Figure 8:
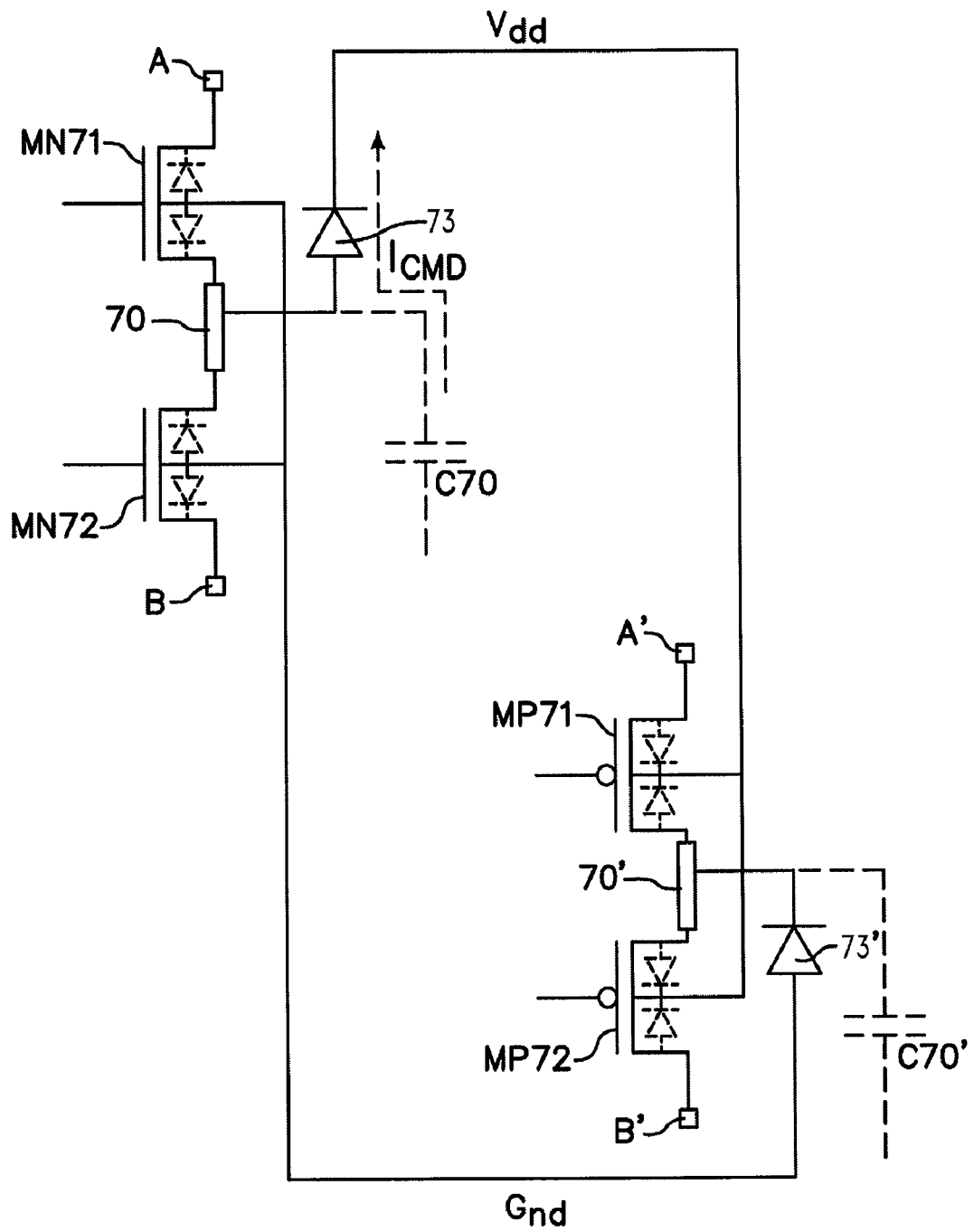
FIG. 8 is a schematic representation of a portion of an electronic circuit which comprises a capacitive island of a first type and a protective element, as well as a capacitive island of a second type and a protective element.

The arrangement shown in FIG. 8 can be employed regardless of the method for performing the CDM test, as the method has no influence on the electrical phenomena observed during electrostatic discharge.

Of course, the examples of the parts of a circuit given above are in no way limiting. There are other circuit layouts in which the same problem is encountered and which can be remedied in the same manner. For example, the common node between two serially-connected condensers can, in certain cases, be charged (either positively or negatively), or the central node of a differential pair and its bias transistor which is of the same family. It is the circuit designer who determines the nodes to be protected, based on his or her understanding of the circuit's operation in unpowered mode. Tools to assist with circuit design can also be programmed to help the circuit designer with this task.

Note that the same protective element, no matter what its type and implementation, can be used to protect two different capacitive islands of the same circuit. It simply would be adapted to support the currents that it is then likely to be used to drain off.

Conversely, if the protective element one wishes to use is not able to support such a current, the element can be duplicated as many times as necessary.

Note that the nodes to be protected 70 and 70' may be located within the heart of the circuit, meaning they are not necessarily nodes corresponding to input/output terminals for the circuit or voltage terminals. They may correspond to such terminals, but they may also be nodes buried deep inside the circuit and be completely inaccessible from outside the circuit.

For differential circuits, the ground terminal can be replaced by a negative voltage terminal. Similarly, there can be several operating voltages with distinct respective values. In all cases, the information of the invention applies in general, in the same manner as previously described, for circuits placed between a high voltage terminal and a low voltage terminal, with the aforesaid applying mutatis mutandis to said high and low voltage terminals in place of the Vdd terminal and the Gnd terminal respectively.

Similarly, nodes A and B, and A' and B', can be voltage terminals or input/output terminals, but can also be nodes functionally buried within the heart of the circuit architecture.

It is advantageous to begin implementing an embodiment in the circuit design phase. The circuit designer analyzes the layout of the circuit in order to understand its operation in unpowered mode when CDM pulses are applied to it. He or she identifies the nodes to be protected, and adds to the circuit diagram the corresponding protective elements. This can also be done wholly or in part by CAD software. Thus the invention can serve as a basis for the development of a new module for CAD software packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated electronic circuit comprising:
   a high voltage terminal and a low voltage terminal;
   a first circuit branch including a first capacitive island node and a first pair of transistors, both of a first conductivity type, coupled between first and second nodes and coupled together at the first capacitive node, the first circuit branch being structured, when the electronic circuit is not exposed to an operating voltage, to only allow the discharge of said first capacitive island node for electrical charges of a first polarity, but not for electrical charges of a second polarity; and
   a second circuit branch including a second capacitive island node and a second pair of transistors, both of a second conductivity type, coupled between third and fourth nodes and coupled together at the second capacitive node, the second circuit branch being structured, when the electronic circuit is not exposed to the operating voltage, to only allow the discharge of said second capacitive island node for electrical charges of the second polarity;
   a first protective element coupled to the first capacitive island node and structured to allow the discharge of said first capacitive island node for charges of the second polarity, when the electronic circuit is not exposed to the operating voltage, and not to allow the flow of an electrical current to or from said first capacitive island node through the first protective element when the electronic circuit is exposed to the operating voltage; and
   a second protective element coupled between the second capacitive island node and the low voltage terminal and structured to allow the discharge of said second capacitive island node for charges of the first polarity, when the electronic circuit is not exposed to the operating voltage, and not to allow the flow of an electrical current to or from said second capacitive island node through the second protective element when the electronic circuit is exposed to the operating voltage.

2. An integrated electronic circuit according to claim 1, wherein the first protective element comprises, for the discharge of positive charges, a diode having an anode coupled to the first capacitive island node and a cathode coupled to the high voltage terminal.

3. An integrated electronic circuit according to claim 1, wherein the second protective element comprises, for the discharge of negative charges, a diode having a cathode coupled to the second capacitive island node and an anode coupled to the low voltage terminal.

4. An integrated electronic circuit according to claim 1, wherein the first protective element comprises, for the discharge of positive charges, a PMOS transistor having a drain coupled to the first capacitive island node and a gate, source and substrate connected to the high voltage terminal.

5. An integrated electronic circuit according to claim wherein the second protective element comprises a thyristor for the discharge of negative charges towards the low voltage terminal.

6. An integrated electronic circuit according to claim 1, wherein at least one of the first protective element and the second protective element comprises a ggNMOS transistor having a drain coupled to the first capacitive island node or the second capacitive island node respectively, and a gate, source and substrate connected to the low voltage terminal.

7. An integrated electronic circuit according to claim 1, wherein the first pair of transistors includes first and second NMOS transistors, and the second pair of transistors includes first and second PMOS transistors.

8. A method for producing an integrated electronic circuit having a determined operation when the electronic circuit is exposed to an operating voltage, said process comprising:
   providing a first circuit branch including a first capacitive island node and a first pair of transistors, both of a first conductivity type, coupled between first and second nodes and coupled together at the first capacitive island node, the first circuit branch being structured, when the electronic circuit is not exposed to the operating voltage, to only allow the discharge of said first capacitive island node for electrical charges of a first polarity, but not for electrical charges of a second polarity;
   providing a second circuit branch including a second capacitive island node and a second pair of transistors, both of a second conductivity type, coupled between third and fourth nodes and coupled together at the second capacitive island node, the second circuit branch being structured, when the electronic circuit is not exposed to the operating voltage, to only allow the discharge of said second node for electrical charges of the second polarity but not for electrical charges of the first polarity;

providing a first protective element associated with the first capacitive island node and structured to allow the discharge of said first capacitive island node for charges of the second polarity, when the electronic circuit is not exposed to the operating voltage, and not to allow the flow of an electrical current to or from said first capacitive island node through the first protective element when the electronic circuit is exposed to the operating voltage; and providing a second protective element coupled between the second capacitive island node and a low voltage terminal and structured to allow the discharge of said second capacitive island node for charges of the first polarity, when the electronic circuit is not exposed to the operating voltage, and not to allow the flow of an electrical current to or from said second capacitive island node through the second protective element when the electronic circuit is exposed to the operating voltage.

9. A method according to claim 8, wherein the first protective element comprises, for the discharge of positive charges, a diode having an anode coupled to the first circuit capacitive island node and a cathode coupled to a high voltage terminal.

10. A method according to claim 8, wherein the second protective element comprises, for the discharge of negative charges, a diode having a cathode coupled to the second capacitive island node and an anode coupled to the low voltage terminal.

11. A method according to claim 8, wherein the first protective element comprises, for the discharge of positive charges, a PMOS transistor having a drain coupled to the first capacitive island node and a gate, source and substrate connected to a high voltage terminal.

12. A method according to claim 8, wherein the second protective element comprises a thyristor for the discharge of negative charges towards the low voltage terminal.

13. A method according to claim 8, wherein providing the first protective element comprises, for the discharge of respectively negative or positive charges, providing a ggNMOS transistor having a drain coupled to the first capacitive island node and a gate, source and substrate connected to the low voltage terminal.

14. An integrated electronic circuit comprising:

a high voltage terminal and a low voltage terminal:

a first circuit branch including a first capacitive island node, and a first pair of transistors, both of a first conductivity type, coupled between first and second nodes and coupled together at the first capacitive island node, and means for, when the electronic circuit is not exposed to an operating voltage, only allowing the discharge of said first capacitive island node for electrical charges of a first polarity, but not for electrical charges of a second polarity;

a second circuit branch including a second capacitive island node, and a second pair of transistors, both of a second conductivity type, coupled between third and fourth nodes and coupled together at the second capacitive island node, and means for, when the electronic circuit is not exposed to the operating voltage, only allowing the discharge of said second capacitive island node for electrical charges of the second polarity but not for electrical charges of the first polarity;

a first protective means, associated with the first capacitive island node, for allowing the discharge of said first capacitive island node for charges of the second polarity, when the electronic circuit is not exposed to the operating voltage, and not allowing the flow of an electrical current to or from said first capacitive island node through the first protective element when the electronic circuit is exposed to the operating voltage; and second protective means, coupled between the second circuit node and the low voltage terminal, for allowing the discharge of said second capacitive island node for charges of the first polarity, when the electronic circuit is not exposed to the operating voltage, and not allowing the flow of an electrical current to or from said second capacitive island node through the second protective element when the electronic circuit is exposed to the operating voltage.

15. An integrated electronic circuit according to claim 14, wherein the first protective means comprises, for the discharge of positive charges, a diode having an anode coupled to the first capacitive island node and a cathode coupled to the high voltage terminal.

16. An integrated electronic circuit according to claim 14, wherein the second protective means comprises, for the discharge of negative charges, a diode having a cathode coupled to the second capacitive island node and an anode coupled to the low voltage terminal.

17. An integrated electronic circuit according to claim 14, wherein the first protective means comprises, for the discharge of positive charges, a PMOS transistor having a drain coupled to the first capacitive island node and a gate, source and substrate connected to the high voltage terminal.

18. An integrated electronic circuit according to claim 14, wherein the second protective means comprises a thyristor for the discharge of negative charges towards the low voltage terminal.

19. An integrated electronic circuit according to claim 14, wherein at least one of the first protective means and/or the second protective means comprises a ggNMOS transistor having a drain coupled to the first capacitive island node or the second capacitive island node respectively, and a gate, source and substrate connected to the low voltage terminal.

20. An integrated electronic circuit according to claim 14, wherein the first pair of transistors includes first and second NMOS transistors the second pair of transistors includes first and second PMOS transistors, the first protective means includes a first diode coupled between the first capacitive island node and the high voltage terminal, and the second protective means includes a second diode coupled between the second capacitive island node and the low voltage terminal.

21. A method according to claim 8, wherein the first pair of transistors includes first and second NMOS transistors, and the second pair of transistors includes first and second PMOS transistors.

* * * * *

UNITED STATES PATENT AND TRADEMARK OFFICE
CERTIFICATE OF CORRECTION

| | | |
|---|---|---|
| PATENT NO. | : 7,889,468 B2 | Page 1 of 1 |
| APPLICATION NO. | : 12/022700 | |
| DATED | : February 15, 2011 | |
| INVENTOR(S) | : Philippe Galy et al. | |

It is certified that error appears in the above-identified patent and that said Letters Patent is hereby corrected as shown below:

Column 10
Claim 5, Line 34, "An integrated electronic circuit according to claim" should read as --An integrated electronic circuit according to claim 1,--.

Signed and Sealed this
Nineteenth Day of April, 2011

David J. Kappos
*Director of the United States Patent and Trademark Office*